(12) United States Patent
Knickerbocker et al.

(10) Patent No.: US 11,587,860 B2
(45) Date of Patent: Feb. 21, 2023

(54) METHOD OF FORMING THIN DIE STACK ASSEMBLIES

(71) Applicant: INTERNATIONAL BUSINESS MACHINES CORPORATION, Armonk, NY (US)

(72) Inventors: John Knickerbocker, Orange, NY (US); Bing Dang, Chappaqua, NY (US); Raymond Horton, Dover Plains, NY (US); Joana Maria, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 16/812,356

(22) Filed: Mar. 8, 2020

(65) Prior Publication Data
US 2020/0211947 A1    Jul. 2, 2020

Related U.S. Application Data

(62) Division of application No. 16/194,377, filed on Nov. 18, 2018, now Pat. No. 10,903,153.

(51) Int. Cl.
| | |
|---|---|
| H01L 23/498 | (2006.01) |
| H01L 23/48 | (2006.01) |
| H01L 21/683 | (2006.01) |
| H01L 21/48 | (2006.01) |
| H01L 21/20 | (2006.01) |
| H01L 21/768 | (2006.01) |

(52) U.S. Cl.
CPC .... *H01L 23/49827* (2013.01); *H01L 21/2007* (2013.01); *H01L 21/4853* (2013.01); *H01L 21/6835* (2013.01); *H01L 21/76898* (2013.01); *H01L 23/481* (2013.01)

(58) Field of Classification Search
CPC ............. H01L 23/49827; H01L 23/481; H01L 21/6835; H01L 21/4853; H01L 21/2007; H01L 21/76898
See application file for complete search history.

(56) References Cited

U.S. PATENT DOCUMENTS

| | | | |
|---|---|---|---|
| 5,910,010 A | 6/1999 | Nishizawa et al. | |
| 7,521,288 B2 | 4/2009 | Arai et al. | |
| 7,999,377 B2 | 8/2011 | Demulder | |
| 8,419,895 B2 | 4/2013 | Dang et al. | |
| 9,029,238 B2 | 5/2015 | Andry et al. | |
| 9,659,917 B1 * | 5/2017 | Koopmans | H01L 24/80 |
| 9,754,907 B2 | 9/2017 | Dugas et al. | |
| 2010/0140811 A1 | 6/2010 | Leal et al. | |
| 2013/0248114 A1 | 9/2013 | Seek et al. | |
| 2014/0295620 A1 * | 10/2014 | Ito | H01L 25/0657 438/108 |
| 2016/0351527 A1 | 12/2016 | Lau et al. | |

OTHER PUBLICATIONS

Appendix P, dated Mar. 9, 2020, attached.

* cited by examiner

*Primary Examiner* — Selim U Ahmed
(74) *Attorney, Agent, or Firm* — Daniel P. Morris; Erik Johnson; Lou Percello, Attorney, PLLC (57) ABSTRACT

Die stacks and methods of making die stacks with very thin dies are disclosed. The die surfaces remain flat within a 5 micron tolerance despite the thinness of the die and the process steps of making the die stack. A residual flux height is kept below 50% of the spacing distance between adjacent surfaces or structures, e.g. in the inter-die spacing.

20 Claims, 10 Drawing Sheets

METHOD OF FORMING THIN DIE STACK ASSEMBLIES

BACKGROUND

The present invention relates to semiconductor die stack structures (die stacks) and methods of making semiconductor die stack structures with very thin dies (or semiconductor chips.) More specifically, the invention relates to die stacks made of thin dies and closely spaced die stacks in one or more arrays of die assemblies and/or die stacks.

Die stacks are made with two or more layers of semiconductor dies or chips that are stacked one above the other, electrically interconnected, and held together to make a single, unified semiconductor structure. Die stacks are sometimes encased in a single package. They are used as a single component in semiconductor circuitry.

"Thin" dies used in die stacks die structures can be on the order of 50 um to 200 um thick. In this thickness range, the dies can more easily be "picked and placed" to create stand-alone die structures often using thermal compression bonding or in some cases, traditional flip chip reflow assembly processes (especially when using larger X-Y interconnection pitch such as 150 um pitch to 300 um pitch interconnections).

However, as semiconductor circuits get smaller, the thickness of the dies becomes smaller and the pitch, or spacing, between the die stacks also becomes smaller (below 50 microns.) In addition, the opposing connections to which the dies and/or die stacks connect become smaller and more tightly spaced, requiring fine interconnects with a fine pitch (which if not processed properly can lead to defects such as interconnect shorts or opens and thus lower assembly yields).

The adhesives that are typically used to enhance die to die or die to package reliability and held thicker dies together in die stacks with larger sizes and spacing can cause problems as the dimensions of the dies and die stack become smaller. This can be due to cleaning prior to underfill adhesive application as well as underfill adhesive fillers such as SiO2 or other fillers and viscosity of the underfill adhesive and ability to flow between interconnections. For example, flux used to remove surface oxides from solder balls and pillars as well as aide holding dies in place during reflow joining can leave behind residues that are detrimental to electrical conductivity between interconnections and thus have negative impact toward reliable product. Further, the flux residue may also degrade adhesion of underfill adhesives causing higher distance to neutral point interconnections to be at risk of failure between dies and between the package connections to the dies and/or die stack. Traditional water or solvent spray-cleaning techniques that remove adhesive residue are less effective, or not effective at all, at much smaller interconnection pitch dimensions, for shorter height interconnections, and for larger die size using area array interconnections. Chemical composition (e.g., ionic components) of these residues can cause stray electrical connection and corrosion problems that lead to reduced yields, poor performance, and early failure.

In addition, as dies become thinner, the dies become more difficult to handle during the die stack assembly. Thinner dies bend during the assembly process and can crack or break. The die bending can cause alignment problems in the die stack assembly and may cause some interconnections to short and others to not contact leaving opens between die or between die and a package. These problems also can lead to reduced yields, difficulties assembling the dies into larger modules, and premature operation or subsequent reliability failures.

There are alternate methods of applying a flux to aide in high interconnection assembly yield, e.g. gases, that don't leave residue or almost no residue but rather leave clean surfaces for bonding solder to circuit pads (pads), solder to solder (e.g. C4 connections), and/or copper to copper connections and support reliability enhancing use of adhesives without traditional water or chemical cleaning. Unfortunately, while use of gaseous flux materials reduces the residual flux problem in small die stacks, they introduce other problems. Since gaseous flux does not have strong adhesive properties, it cannot hold the dies together well while they are being assembled into a stack. Therefore, use of gaseous flux materials alone may not be adequate for traditional solder reflow or even thermal compression bonding and may not achieve good assembly yield due to difficulties in die stack assembly including bending and breaking of dies, misalignment, shorts and opens. These problems would reduce yields and cause future operation problems.

SUMMARY

According to an embodiment of the present invention, a die stack has two or more semiconductor dies disposed one above the other. The semiconductor dies have a die thickness less than 50 microns and an inter-die spacing between the dies ranging between 10 to 30 microns. Each semiconductor dies in the die stack has a die surface that is flat or planar, e.g. the distance between the die surface and a flat parallel plane varies no more than 2 to 5 microns or the die surface is flat/planar within a 5 micron tolerance, despite the thinness of the die. In a more preferred embodiment, the planarity tolerance is around 2 microns. Handlers and processes are disclosed to maintain the flatness/planarity of the die surface of each die going through the process steps of making both a die stack and an array of die stacks. Multiple dies with different sizes and shapes can be handled in a single operation. Residual flux is kept below 5% of the volume or below 50% of the height between any adjacent surfaces or structures, e.g. in the inter-die spacing.

DETAILED DESCRIPTION

The descriptions of the various embodiments of the present invention have been presented for purposes of illustration but are not intended to be exhaustive or limited to the embodiments disclosed. The Figures are not drawn to scale. Given this disclosure, many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention discloses preferred embodiments of handing ultra-thin semiconductor die structures with die thicknesses between 5 to 50 um or less than 50 um. Dies this small need mechanical support to remain flat/planar during the moving, positioning, and bonding operations used to make a die stack assembly. In some embodiments, the support mechanism can be removed or released after bonding.

Figure 1:
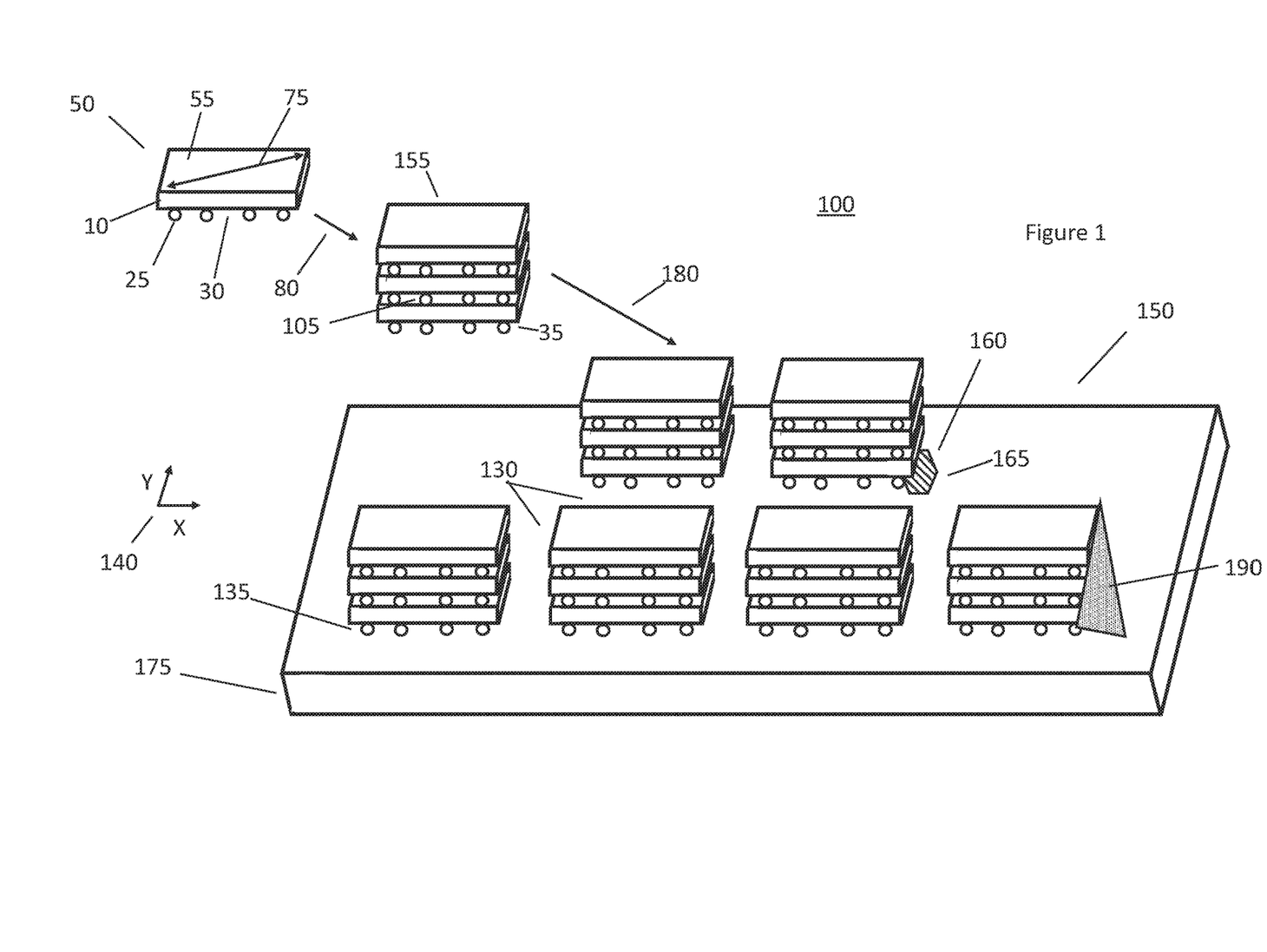
FIG. 1 is an illustration showing a thin die, a die stack made of two or more thin dies (a thinned die stack), and an array of thinned die stacks.

FIG. 1 is an illustration 100 showing a thin die 50, a die stack 155 made of two or more dies 50 (a thinned die stack or die stack 155 has at least one thin die 50), and an array of die stacks 150. These different structures are shown together to illustrate the relationships among the structures, not necessarily to imply any process steps for creating one structure from another.

Structure 50 is a thinned die or semiconductor chip. The die 50 can have a plurality of devices 205 (shown in FIG. 2) a die thickness 10, a die surface 55, die connections 25, and spacing 30 between the die connections 25 (die connection spacing 30.)

The die connections 25 can be solder bumps, as in C4 (Controlled collapse chip connection) connections; copper pillars, copper pillars with solder tips, copper pads, or other conductive connections. Typically, the die connections 25 can be electrically and mechanically connected to "opposing" but similar connections on other devices, chips, substrates, etc. The die connection 25 height 35 is between 10-30 microns (um), but more likely to be 10-20 um, or even lower than 10 um. Typically, the die connection spacing 30, i.e. the die connection pitch, is on the order of 30 um but larger or smaller pitch is also used.

The die thickness 10 is less than 50 um, typically in the range of 5-50 um, with the die thicknesses 10 approaching the lower end of this range, e.g. 5 um.

The "flatness or planarity" 75 of the die surface 55 can be measured in various ways. For example, the distance to the die surface 55 from a parallel flat surface along a diagonal of the die 50 can be measured at 2 or more points along the diagonal and a deviation from the average distance can be determined. Alternatively, the distances can be defined as being within a tolerance from one another, i.e. all distance measurements have to be within 2 to 5 um of one another. As dies 50 become thinner 10, it is important to keep the die surface 55 flat and supported so that the die 50 does not warp and/or crack during handling and assembly processes. A warped or cracked die can be difficult to connect and can cause degraded or failed performance.

The present invention keeps each die flat and supported against a rigid, flat surface while being handled during movement, positioning, assembly, flux applications, and electrical and mechanical bonding to other connections and structures.

In preferred embodiments, the dies 50 can be stacked 80, e.g. mechanically and/or electrically connected above and/or below to another die 50, to form a die stack 155. Since the die connection height 35 can be between 10-30 um (preferably under 20 um, and trending below 10 um), the spacing 105 between dies 50 (inter-die spacing 105) in the die stacks 155 is on the order of 10-30 um or less. At these small dimensions, the small inter-die spacing 105 can make it difficult to remove adhesives and other material caught in the inter-die spacing 105 during the assembly, flux, and bonding processes. This unremoved material, e.g. residue flux, can cause circuit failure or degradation.

In preferred embodiments, the die stack 155 can be assembled 180 on substrates 175 in arrays 150 that can have multiple die stacks 155 in multiple directions, e.g. both the X and Y directions 140, resulting in an "X-Y" size of the array 150 on the substrate 175. The X-Y size of the array 150 can vary from a larger X-Y size of larger than 5 to 10 millimeters (mm) or larger to a smaller X-Y size of 2 to 10 mm.

Each die stack 155 attached to the substrate 175 has a substrate-die stack spacing 135 between the die stack 155 and the substrate 175 where the die stack is mechanically and/or electrically bonded to the substrate 175 connections. The substrate-die stack spacing 135 is on the order of the die connection height 35, e.g. 10-30 um (or even smaller than 10 um.) In addition, there is an inter-die stack spacing 130 or die stack pitch 130 between the die stacks 155 connected to the substrate 175. In preferred embodiments, the inter-die stack spacing (or die stack pitch) 130 is on the order of 10 to 50 um, trending toward a 10 to 30 um pitch, and preferably below a 20 um pitch. However, materials from the assembly processes can be difficult to remove from these small inter-die stack spacing 130 distances as well. These accumulations also can cause circuit deterioration or failure.

Preferred embodiments of this invention have little or no residual flux in the inter-die spacing 105, substrate-die stack spacing 135, or die stack pitch 130 regions. Each die 50 either independently, in a die stack 155, and/or in an array 150 has a degree of flatness 75 of 2 to 5 um deviation/tolerance or less, e.g., from one corner to opposite corner of the surface 55 of the each of the dies 50.

One of the problems associated with circuits of small dimensions is flux that remains around connections and/or in spaces after electrical bonds are made. This residual flux 160 can remain in spaces including the inter-die spacing 105, the substrate-die stack spacing 135, and the inter-die stack spacing 130. Residual flux post assembly/joining due to tight interconnection pitch and/or short height of interconnections is detrimental to the product due to potential risk of causing an electrical short and poor adhesion for adhesives. Each of these defects could lead to lower product yield and/or product reliability failures. (For clarity, the residual flux 160 is shown as a typical example in one location in FIG. 1.) In a preferred embodiment, the residual flux 160 takes up less than 5% of the volume occupied by these spaces (105, 135, and 130.) As an alternative measurement, a height 165 of the residual flux is measured. In preferred embodiments, the residual flux height 165 is less than 500% of the space distance, more preferably less than 20% of the spacing and even more preferably less than 5% of the spacing. For example, if the inter-die stack spacing/pitch 130 is 50 um, the residual flux height 165 would be less than 25 um in the inter-die stack spacing region 130.

In assembly, a pre-applied adhesive may be utilized during joining or after bonding is completed. A post apply underfill 190 and or fillet 190 (shown only in one typical location for clarity) can be applied to the die 50 and/or one or more of the die stacks and/or to the die or die stack to package assembly. For pre-apply adhesive, the fillet can fill the spaces including the inter-die spacing 105, substrate-die stack spacing 135, inter-die stack spacing 130, and die connection spacing 30. For post assembly adhesive, the adhesive can fill the spaces including the inter-die spacing 105, the substrate-die stack spacing 135, the inter-die stack spacing 130, and die connection spacing 30 following capillary flow and curing of the adhesive or pressure applied adhesive filling and cure or alternate adhesive application methods. The fillet/underfill 190 shape can be controlled by capillary fill, vacuum and/or pressure application, wetting surfaces, laser trimming, dicing or scribing, molding, or other suitable methods. The fillet/underfill 190 may have post adhesive application and cure and have deposited a moisture barrier layer to protect the dies 50 and interconnections from moisture, improve structure mechanical, electrical and thermal robustness, avoid potential interconnection corrosion and therefore improve handling yield and subsequent overall product reliability. The adhesive with improved thermally conductive fillers and/or surface metal coating can also provide benefit with proper optimization of design, thermal and electrical interconnections, adhesive and surface coating, can aide in product reliability, power delivery & distribution and for heat removal from die stacks 155.

Thin dies 55, die stacks 155 with thin dies, and arrays 150 of die stacks are important in many new applications such as but not limited to: cognitive computing, e.g. artificial computing (AI): machine learning; cloud computing; and the Internet of Things (IoT) where high bandwidth and higher density of interconnections are needed both in large systems and smaller systems. This drives the need for chip to chip fine pitch interconnections 105 and/or die stacks 155 with thinned 10 dies 50.

In some artificial intelligence applications, high numbers of interconnection between dies 50 and die stacks 155 are needed with fine pitch 130 interconnections on large X-Y dimension arrays 150, e.g. graphic die arrays 150 often need to be larger than 10 mm to 20 mm in size. This application space needs fine die stack pitch 130 and interconnections and high-density interconnections between dies in the inter-die spacing 105 integrated in the die stacks 155.

In IoT applications, die sizes with X-Y dimensions on the order of less than 2 mm to 6 mm size may be interconnected with memory and/or sensors in the form a small package or the memory/sensor can reside in a die stack 155. In this case, to lower cost and power use, a small size die 50 and high volume production may be needed to support the high volume applications.

The use and assembly of small (e.g. thin) dies 50, die stacks 155, and die stack arrays 150 enabled by this invention offers advantages in advanced circuit nodes such as 90 nm to less than 10 nm nodes of smaller X-Y size, lower power use, and higher interconnection density between dies 50 and die stacks 155. Fine pitch interconnection of less than 50 to 60 um die stack pitch 130 are enabled. Further, thinner die 50 in the die stack 155 have shorter vertical interconnection distances thereby reducing latency between the die 50.

There is a need to support assembly and integration of multiple dies 50 and die stacks 155 in large arrays 150 at high yield with precision assembly of both the larger X-Y die array sizes (i.e. greater than 5 mm to 30 mm arrays 150 with very high interconnectivity especially when using one or more thinned dies 50 or die stacks 155 during assembly. The need extends to making high yield and high volume, smaller X-Y die assemblies with fine pitch interconnections and thinner dies 50. Multiple die stacks 155 are assembled at the same time to create low cost heterogeneous assemblies such as for Internet of Things (IoT) applications. In addition, the interconnections from the die stacks or integration of multiple die into heterogeneous integrated assemblies or multi-chip packaged assemblies with different sizes and shapes is needed. The importance of maintaining high yield of these assemblies requires tight control of the fine pitch interconnections both between the die and to external circuitry by using precision fixtures/handlers that tightly control planarity of the dies, interconnections, and die to die assemblies (die stacks 155 and/or adjacent mounting and pitch of dies 50, die stacks 155, and other components.)

To date, many electronic systems have used interconnections using greater than 50 um to 250 um or larger area array interconnection pitch 130 between die stacks 155. Interconnections at these lower densities includes wirebonding wires, or other interconnections with fewer input/output pins and typically at much lower total interconnection bandwidth. In these area array connections, flip chip technology has most often been used for lower latency with solder reflow using a flux in the process during joining to aide high yield assembly. Subsequent to solder joining, the flip chip dies are cleaned with water flow between die and package or within a die stack. A capillary underfill adhesive is applied and cured to provide improved mechanical properties and to support improved application reliability.

However, these technologies cannot provide the production levels and yield rates for assemblies with smaller interconnection pitch and reduced interconnection height required to support higher bandwidth, lower latency, thinned dies, and miniaturization needed in newer applications in areas like AI, machine learning, IoT, sensor applications, and mobile devices.

For example, the use of flux cleaning following solder reflow or thermal compression joining and subsequent capillary adhesive underfill 190 may not be used efficiently for larger X-Y die sizes, finer pitch interconnections, and shorter height interconnections due to inadequate cleaning of flux residue and difficulty achieving residue removal as well as difficulty achieving adhesive flow in small pitch interconnections of short height.

Figure 2:
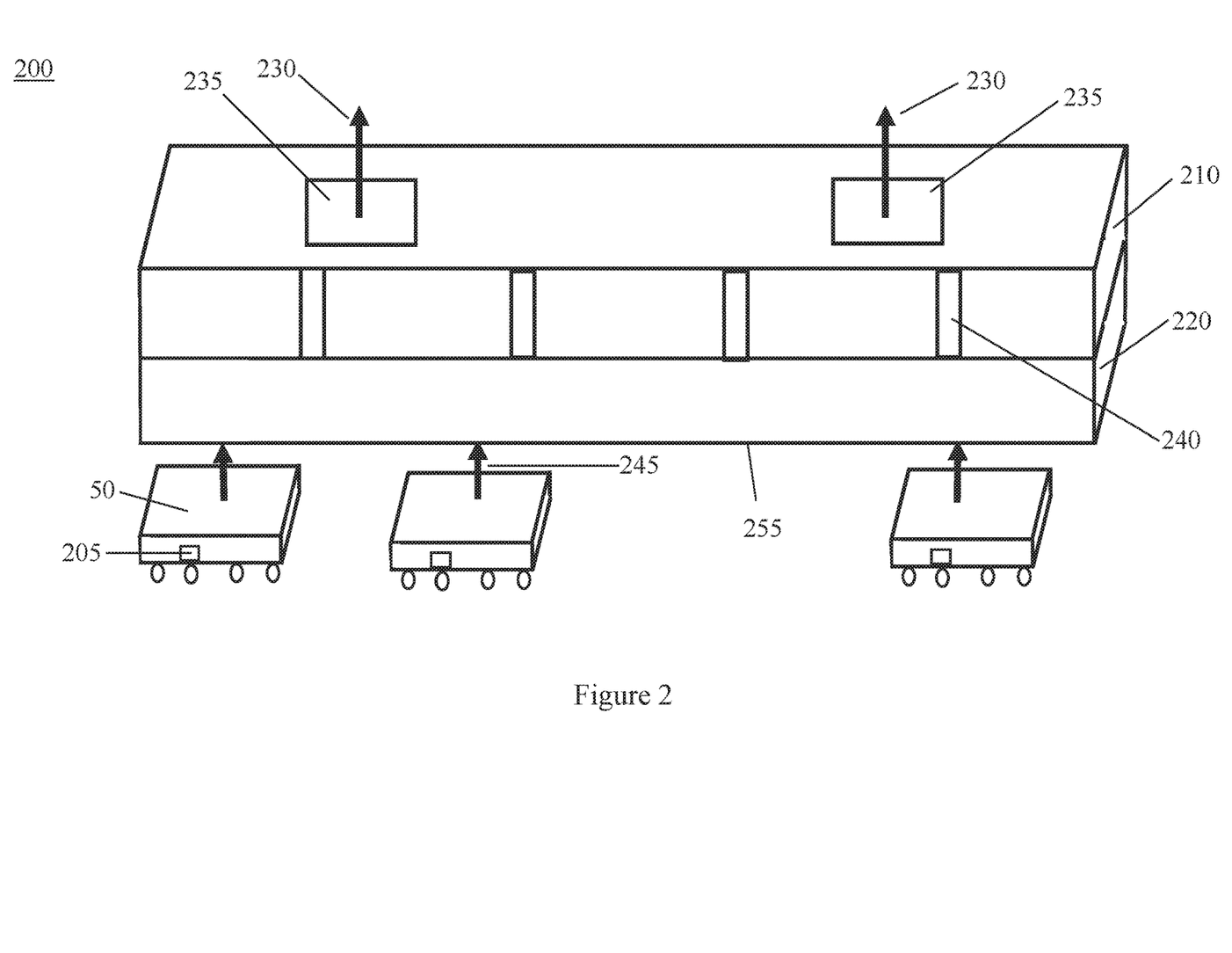
FIG. 2 is a diagram of one preferred handle fixture apparatus used to make one thinned die stack or multiple thinned die stacks simultaneously.

FIG. 2 is a diagram of one preferred handle fixture apparatus 200, or vacuum chuck 200, used to make one thinned die stack 155 or multiple thinned die stacks simultaneously in an array 150.

In one preferred embodiment, the vacuum chuck 200 is a "vacuum transfer" device. A vacuum 230, or source vacuum 230, is applied to one side (here the top) of the vacuum chuck 200. Fluid volume (e.g. air) is removed from the body of the vacuum chuck 200 and a creates a vacuum 245 on the other side (bottom) 245 of the vacuum chuck 200. The created vacuum 245 can be used to pick up and/or hold in place the dies 50 during which time the dies 50 can be machined or otherwise processed, moved, positioned, held in place, and/or metallurgically bonded to other components, e.g. to opposing connections. The created vacuum 245 holds the surface 55 of the dies 50 against a rigid flat surface 255 of the vacuum chuck 200 so that there is little or no bending of the die 50 even during bonding operations or changes in temperature.

The created vacuum 245 can be distributed evenly over the bottom surface 255 of the vacuum chuck 200 or can manifest in local points on the bottom surface 255 depending on how the vacuum chuck 200 is made.

In one preferred embodiment, the vacuum chuck 200 comprises two layers: i. a top layer 210 connected to a vacuum fixture (not shown) and ii. a bottom layer 220 that distributes the vacuum in a particular way to the bottom surface 255. The vacuum fixture 230 can be attached to the top layer 210 at points in the top layer 210 that have seals 235 to prevent the vacuum 230 from leaking from the vacuum chuck 200. In some embodiments, the entire exterior surface of the top 210 and bottom 220 layers are sealed except regions in the bottom surface 255 so that the created vacuum 245 will be expressed only on the bottom surface 255. In preferred embodiments, the top layer 220 will have etched channels 240 either on the top and/or bottom surface of the top layer 210 and/or through the top layer 210 to the bottom layer 220 so the source vacuum 230 is connected to and flows through the bottom layer 220 to create the vacuum 245 and apply holding pressure on the dies 50.

In a preferred embodiment, the top layer 210 is made from a rigid material like silicon (Si), glass, metal, ceramic, or polymer with vacuum channels 240 on and/or through it.

The bottom layer 220 can be made of ceramic material such as SiC or Si3N4 or Al2O3, Si with etched channels as well. Alternatively, the bottom layer 220 can be made from a porous material that permits air (or other gas) to pass through and create the vacuum 245 on the bottom surface 255. The bottom layer 220 also can be a combination of etched channels and porous material.

In alternative embodiments, the top layer 210 is not used. The vacuum source 230 is attached to the top of the single bottom layer 220 which has a sealing layer (not shown) around the top and sides of the bottom layer 220 except for the penetrations receiving the source vacuum 230 and areas on the bottom surface 255 distributing the created vacuum 245.

In a preferred embodiment, the bottom surface 255 is smooth and rigid, e.g. with no more than a 2 to 5 um deviation in flatness/planarity, so the bottom surface 155 causes no bending to the dies 50 held in place by the created vacuum 245.

The vacuum source 230 can be shut off (or reduced) to release the vacuum chuck 200 from the dies 50.

Figure 3:
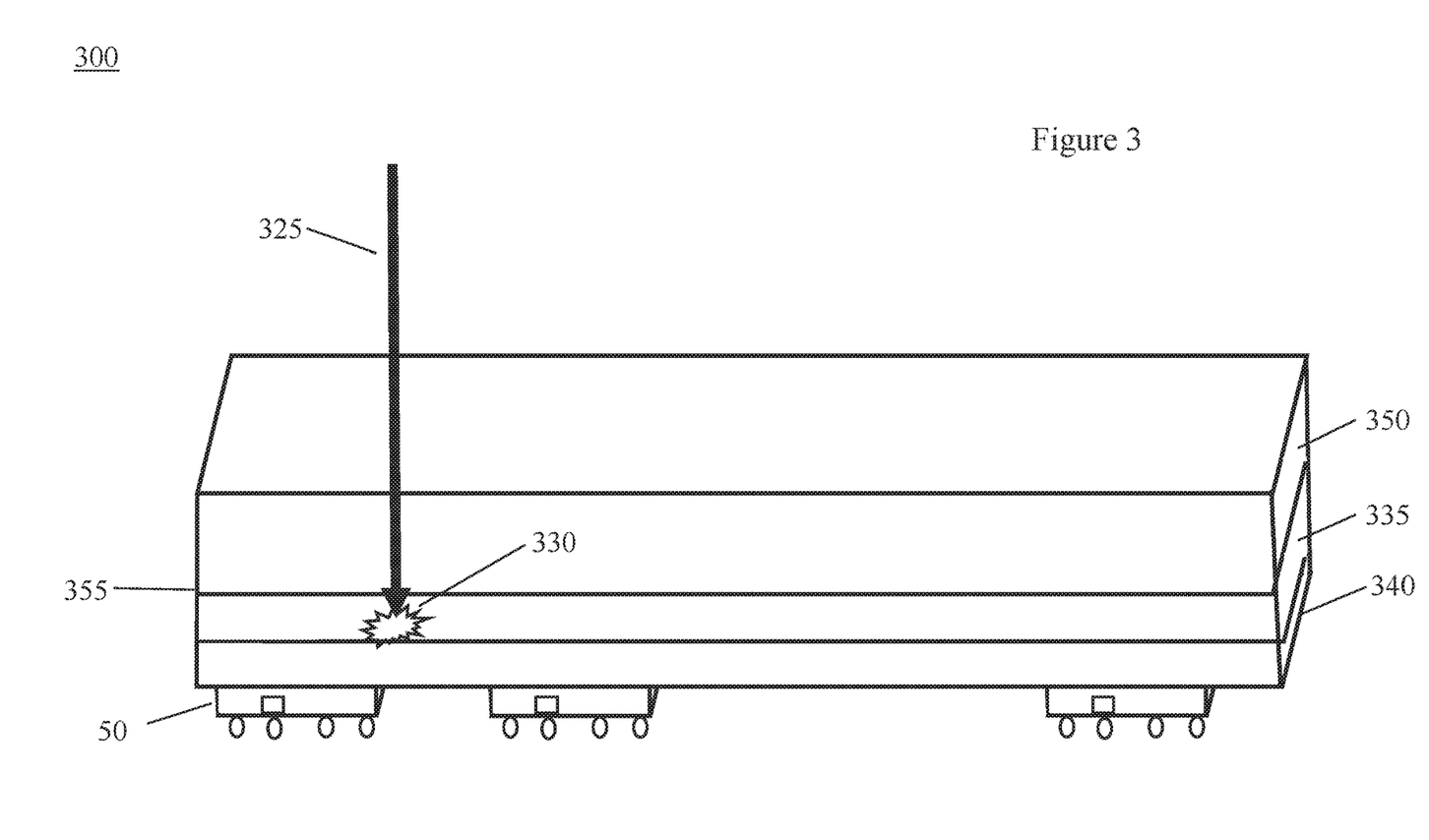
FIG. 3 is a diagram of an alternative preferred handle fixture apparatus used to make a thinned die stack or multiple thinned die stacks simultaneously.

FIG. 3 is a diagram of an alternative preferred handle fixture apparatus 300 used to make one thinned die stack 155 or multiple thinned die stacks 150 simultaneously.

This handle fixture 300 comprises a radiation transparent handle 350, along with a preferred two layers comprised of a release layer 335, and a temporary adhesive layer 340. Alternatively, the release layer 335 and temporary adhesive layer 340 may be combined into one layer by having the radiation absorbing materials integrated into the adhesive layer (not shown).

The adhesive layer 340 adheres the dies 50 through the release layer 335 to the bottom surface 355 of the rigid, radiation transparent handle 350. In preferred embodiments, the adhesive layer 340 is less than 1 to 5 um in thickness and made of material that rigidly holds the dies in place but can easily be removed. Preferred materials used in the adhesive layer 340 include: a polyimide based adhesive for high temperature compatibility such as up to 300 C to 400 C, or a phenoxy or acrylic based polymer materials for temperature compatibility to 260 C to 300 C or alternate materials dependent on temperature and processing compatibility.

In a preferred embodiment, the adhesive layer 340 uses a controlled release layer and temporary adhesive such as high temperature polyimide-based adhesive to maintain the die or dies or other components flat and in precision position mounted on a rigid handle or fixture to ensure robustness of stack during assembly and post assembly use in module assembly and application. For example, the release layer 335 and adhesive layer 340 when using the handle or fixture or vacuum fixture along is rigid enough so that the die 55 is maintained flat without bending and the release layer 335 and adhesive layer 340 can be easily and completely removed and cleaned following assembly once the die 55 is bonded to another die or package or die stack which is either thick enough to remain rigid or is also held by appropriately supported release layer, adhesive and handle or fixture or vacuum fixture alone.

An example of a temporary adhesive used in the adhesive layer 340 includes a high temperature polyimide-based adhesive, e.g. HD Micro 3007 ("Hitachi-Dupont" Micro 3007 adhesive). The use temperature for the adhesive is about 320 to 350 degrees Celsius and perhaps as high as 360 to 400 degrees Celsius for shorter assembly times. Other high temperature adhesives can include other polymers such as phenoxy materials with temperature compatibility to about 260 to 300 degrees Celsius maximum use temperature.

Additional structural enhancements of these structures can be obtained by also incorporating other permanent adhesives into the stacked die structures or from die to package or die stack to package. Examples include controlled adhesive like capillary underfill adhesive flow and subsequent cure, pre-applied adhesive that bonds and cures during assembly joining, post interconnection use of adhesive using vacuum and/or pressure assist and subsequent cure, B-staged and on one or both surfaces being joined and cured after or during joining, use of a stress relief layer such as photo sensitive polyimide put around copper studs or solder interconnections to minimize stress levels from interconnection to die or packages, and subsequent adhesives as described above. Use of these permanent adhesives in the above cases, typically aides in mechanical robustness of the stack, interconnections and enhances the product reliability for a longer lifetime of use prior to potential interconnection and stack failure.

The temporary release layer 335 is made of a material that also rigidly holds the dies 50 in place but can be ablated or decomposed by exposure to electro-magnetic radiation 325 such as with a laser or scanning laser which causes the release layer 335 to detach from the radiation transparent handle 350 and the adhesive layer 340. In preferred embodiments, the release layer 335 is less than 0.5 um in thickness. The materials making up the release layer 335 depend on the energy level of the radiation that can pass through the radiation transparent handle 350. Preferred materials used in the release layer 335 are ablated 330 by infrared light 325 and/or ultraviolet light 325 and may include but are not limited to: aluminum, carbon black or other absorbing materials for IR light and UV absorbing materials such as organic avobenzone, oxybenzone and octyl methoxycinnamate, and/or inorganic materials such as carbon black, titanium dioxide and zinc oxide or combinations therein for IR and UV absorption, respectively.

In one preferred embodiment, an adhesive can also include a thin release layer for room temperature debonding as discussed above with compatibility for a silicon handle wafer and IR laser debonding or compatibility with a glass handle wafer and UV laser debonding. Examples of references for laser debonding with glass handle UV laser de-bond such as but not limited to 355 nm (see U.S. Pat. No. 8,419,895) and for Si debonding with IR laser (see U.S. Pat. No. 9,029,238.)

The electro-magnetic radiation transparent handle 350 is made of any rigid material that is transparent to radiation 325 used to ablate 330 the release layer 335. In preferred embodiments, the electro-magnetic radiation 325 is provided by a laser. Preferred materials for the radiation transparent handle include silicon (Si) for infrared lasers 325 and glass for ultraviolet lasers 325.

In preferred uses for the handler fixture 300, a release layer 335 is applied to the surface of the electro-magnetic radiation transparent handle 350. Then an adhesive layer 340 is attached to the surface of the release layer 335. The handler fixture is now placed on the die(s) so the adhesive layer 340 attaches and cures to the surface of the die(s) 50. At his point, the dies 50 can be machined or otherwise processed, moved, positioned, held in place, and/or metallurgically joined/bonded to other components, e.g. opposing connections. Note that the adhesive layer 340 can be attached to the top or bottom of the die 50, even to the side of the die 50 with the die connections 25.

When the die connection(s) 25 are mechanically joined/bonded and supported, the electro-magnetic radiation transparent handle 350 can be removed by applying radiation 325 that ablates 330 the release layer 335 and separates the die(s) 50 and adhesive layer 340 from the electro-magnetic radiation transparent handle 350. The adhesion layer 340 is removed from the die(s) 50 by the appropriate methods, e.g. chemical solvents, for removing the adhesive material.

In preferred embodiments, the bottom surface of the electro-magnetic radiation transparent handle 350 is machined to be flat and smooth so that the surface 355 deviates less than 2 to 5 um from a perfectly flat/planar surface 355.

Figure 4:
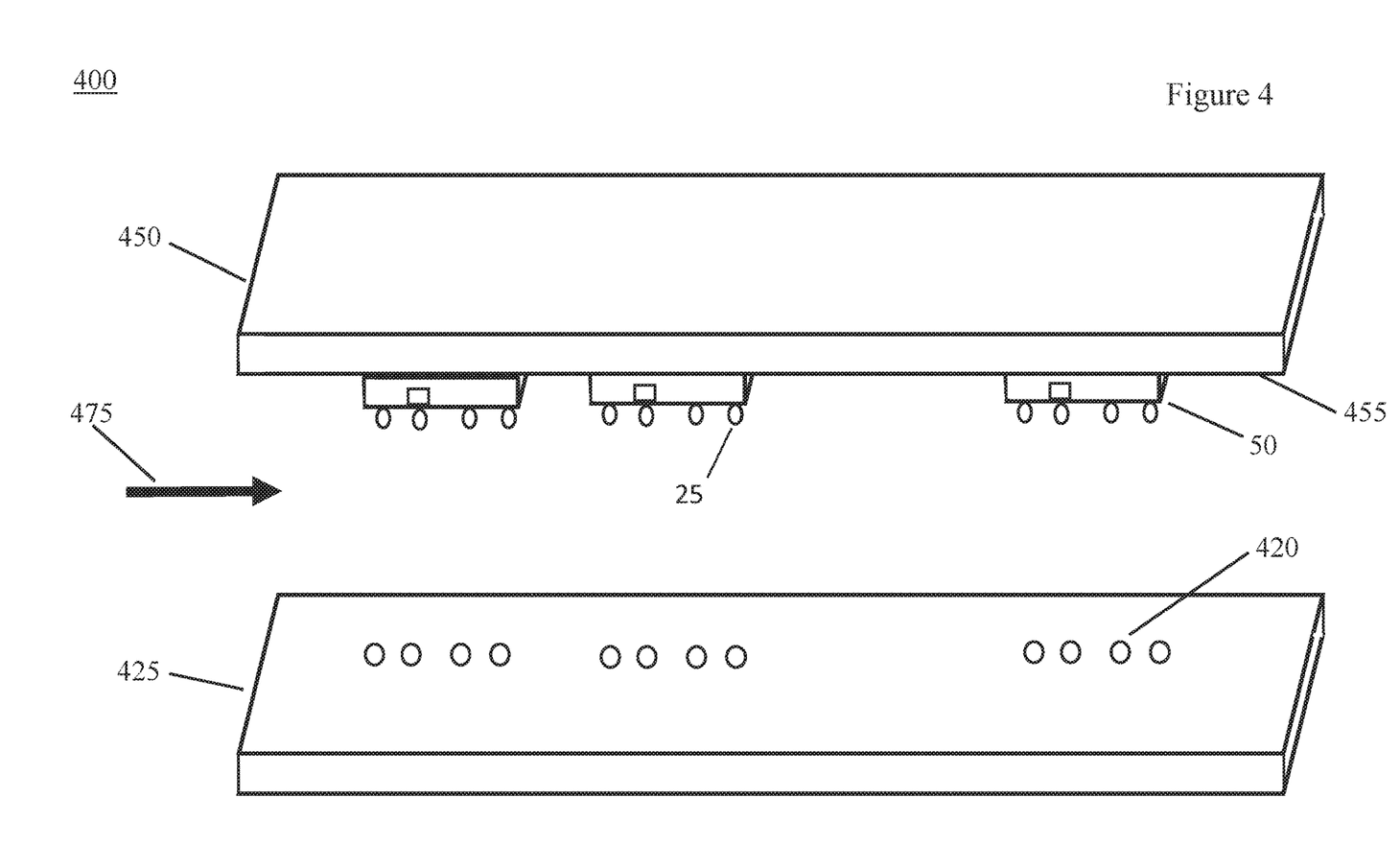
FIG. 4 is a diagram showing a process step of using a handler fixture apparatus to hold one or multiple dies securely while exposing the dies to a gaseous flux.

FIG. 4 is a diagram showing a process step 400 of using a handler fixture apparatus 400, handler 450, that holds one or multiple dies 50 securely while exposing the thin dies to a gaseous flux 475.

The gaseous flux 475 cleans and removes oxides from the electrical connections (25, and in preferred embodiments, opposing connections 420) before positioning the die(s) 50 and the die(s) connections 25 and compressing together the die connections 25 and opposing electrical connections 420 on a substrate 425.

In preferred embodiments, the handler 450 can be either vacuum chuck 200, handler fixture 300, or any other handler 450 that holds the dies 50 in fixed position on the handler 450, can move and precisely position the dies 50, and can maintain the flatness of the dies 50 within 2 to 5 um.

For assembly of heterogeneous integrated components or die and die stacks, a handle fixture can be utilized for planar die and die stack joining to a thin interposer or redistribution layer or alternate power distribution and/or signal layers package subsequent to joining this assembly, with for example multiple die components and/or die stacks, prior to release from the temporary handle fixture or vacuum fixture. The integrated sub-assembly can then be held from their non-joined top surfaces (even if at variable heights from the thin interposer, or redistribution layer or alternate package) by flipping the assembly and attaching to a second temporary handle fixture or vacuum fixture. This then permits the joining of additional components, die, thin bridge packages or chips and joining of the entire assembly to a carrier package or board. After these assemblies the second temporary handle fixture or vacuum fixture can be removed and the integrated heterogeneous multichip—multi die stack—multi component package can be used. This new assembly method permits assembly one top and bottom of a thin package or interposer, joining of thinned die or components with high precision and maintaining planarity of these die, packages and components during assembly for high yield.

In preferred embodiments, the flux 475 is a gas vapor flux that cleans but does not leave a residue on the electrical contacts (25, 420) or die 50 that would require cleaning. For instance, formic acid mixed with a "formation gas" (FG) or formic acid mixed with nitrogen (N2) gas, or other "no clean fluxes" can be used.

Formic acid is used as a reducing agent similar to "formation gas" (FG), "no clean flux," or in nitrogen (N2) gas to remove oxidation layers and generally clean contacts before electrical connection/bonding, e.g. soldering. Formic acid (HCOOH or HCO2H in N2) in a gaseous state leaves no residue and is used in some applications and tools in industry. FC250, a precision bonder, optionally uses formic acid in thermal compression bonding tools. Typically, formic acid should be used at a temperature over 160 C, its activation temperature, for the flux to be effective in assembly uses.

Alternative flux compositions and methods can be used. A pure nitrogen (100% N2) can be mixed with a 2-8% by volume amount of formic acid. The preferred concentration of the formic acid is 2-5%, but ratios depend on vapor pressure of the gases in the mixture and the temperature. Mixtures at higher temperatures preferably have a higher percentage of formic acid.

Where formic acid HCOOH or HCO2H in N2) is mixed with N2, the proportions can vary.

Note the formic acid with N2 can provide good flux for bonding many different solder compositions (such as Sn, SnAgCu, Sn Ag, SnCu, SnBi, SnBiAgCu, SnBiAg, SnBiCu, In, InBi, etc.) Note that use of formic acid as replacement of flux can provide minimal or no residue on metal surfaces, can provide good flux reaction for small features such as fine pitch interconnection of 50 um pitch and smaller. Formic acid can be used with connections like 25 um diameter solder bumps, metallic pads, copper pillars with solder, copper pillar with Ni cap and solder on top and spaces/pitch of 25 um. Similarly features of smaller interconnection pitch and spacing are also possible with features of 20/20 (i.e., 20 um interconnection diameter/20 interconnection spacing), and other interconnection diameter and spacing such as but not limited to 10/10, 5/5, 1/1 or alternate size and pitch. These interconnection pitch and spacing can be applied to different types of interconnection stack or structure such as solder ball to pad, solder ball on pad to solder ball on pad, solder ball on pillar to pad or alternate structures.

In some preferred embodiments, the handler 450 positions and holds the contacts (25, 420) together, e.g. in thermal compression, so a tacky flux is not needed.

During die contact 25 and substrate connection 420 exposure to the flux 475, the die surfaces 55 are kept planar, within 2-5 um deviation because the bottom 455 of the hander 450 is planar within 2-5 um.

Note that the handler 450 can hold one die 50 or multiple dies 50 and the dies can be positioned with equal spacing or not. The dies can also be different sizes and shapes. In one preferred embodiment, the handler 450 is positioned over a wafer and the hander 450 attaches (e.g., by vacuum pressure or adhesive) to the dies 50 before the dies are singulated so that the dies are supported both by the wafer structure and the handler 450 before singulation. In this manner, the dies 50 do not experience the bending stresses experienced by the dies in a "pick and place" operation.

The handle or fixture planarity can be ensured based on the thickness of the handle or fixture and the fabrication method such as singulation of a planar silicon wafer that may have planarity to nm level tolerances. For silicon, or similarly a SiC or glass or alternate handle or fixture material, methods such as precision grinding, chemical/mechanical polish and characterization of surfaces to ensure planarity.

Figure 5:
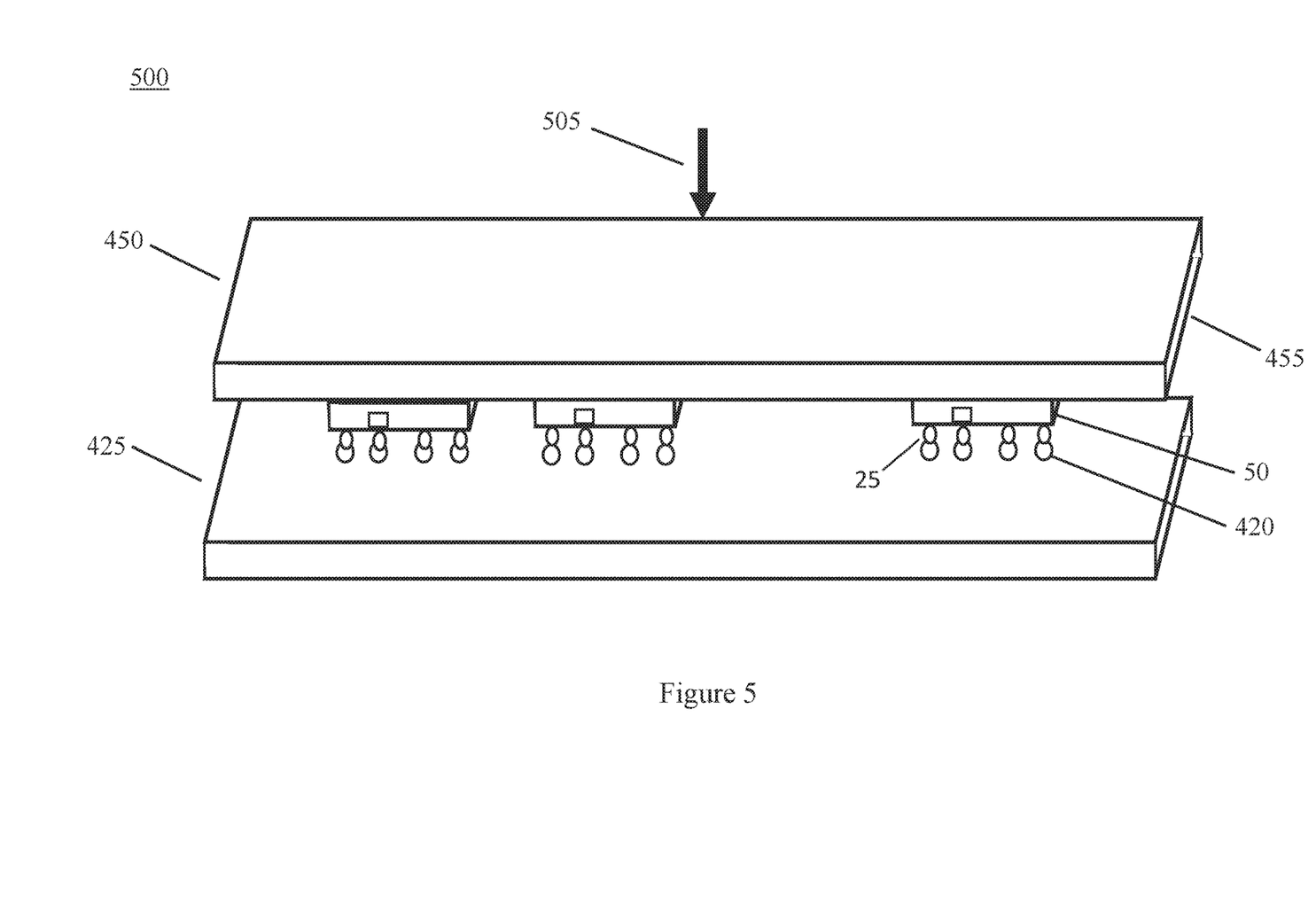
FIG. 5 is diagram showing a bonding process of using a handler fixture apparatus to hold one or multiple dies securely in physical contact with electrical connections on a substrate while mechanically and electrically bonding the dies to a substrate.

FIG. 5 is diagram 500 showing a bonding process step of using a handler fixture apparatus 450 holding a single die 50 or multiple thin dies 50 securely so that the die contacts 25 and opposing electrical connections 420 on a substrate 425 are compressed together 505 while mechanically and electrically bonding the die contacts 25 to the opposing substrate connections 420.

There are various methods 500 of bonding the die contacts 25 to the substrate connections 420 to provide electrical bonding between the contacts (25, 420) and mechanical support to the dies 50 from the rigid substrate 425. Again, the handle fixture 450 can position, hold, and cause the bonding of one die 50 or multiple dies 50, in a uniform array spacing or a non-uniform spacing depending on the number and position of the dies 50 when the handler 450 picks up the dies 50. The dies 50 can also be different sizes and shapes.

After the dies 50 and their die connections 25 are positioned and held, a bonding process of electrically and mechanically attaching the die connections to opposing connections outside the die 50, e.g. on the substrate 425, on other dies 50, or on other devices, can be performed. These electrical contacts (25, 420) can be solder to pad, copper pillar with solder to solder pad, solder to solder (e.g. C4 connections), copper to copper, or any other connection structures that can enable a low resistance path for electrical current to flow.

Once the dies 50 are positioned so that the electrical contacts (25, 420) are in physical contact, a thermal compression step (controlled raised joining temperature with some controlled applied force) can be performed where pressure 505 is applied to the handler 450 that compresses the contacts (25, 420) together while heat is applied. The heat causes the electrical contacts such as solder material to melt and (25, 420) metallurgically fuse or join to an opposing pad (often referred to a under bump metallurgy such as but not limited to a Au—Ni—Cu—Ti pad), particularly if the one or more of the contacts one at least one side of the connections is solder or has solder on its surface such as solder ball on pad, solder on pillar or alternate structure). The heat can be applied to bond all the dies 50 uniformly at the same time or to sequentially bond one die 50 or group of dies 50 at a time. Thermal compression tools such as Torray bonder or SET FC 150 or FC 250 bonder or alternate bonding tool can be used to perform this bonding 500.

Alternatively, particularly for contacts (25, 420) with small surface areas, a bond is formed by surface wetting, adhesion/surface tension of the contacts (25, 420) after they are compressed 505 together during solder melting and reaction and once cooled, the solder solidifies and maintains a good bond.

In other preferred embodiments, the handler 450 maintains the pressure 505 holding the contacts (25, 420) together while solder reflows to establish an electrical, mechanical, and metallurgical connection between the contacts (25, 420.) This reflow bonding step 500 can be performed in a chamber or on a moving belt traveling through a reflow furnace. Tools such as a Heller reflow belt furnace or an ATV reflow oven can be used for this assembly method.

Once the bonding 500 is completed, the handler 450 is disconnected from the dies 50 as described in FIGS. 2 and 3 above. Since the dies 50 are now bonded 500 the substrate 425, the dies 50 are mechanically supported, so there is no need for the handler 450 to maintain die surface 55 planarity.

Figure 6:
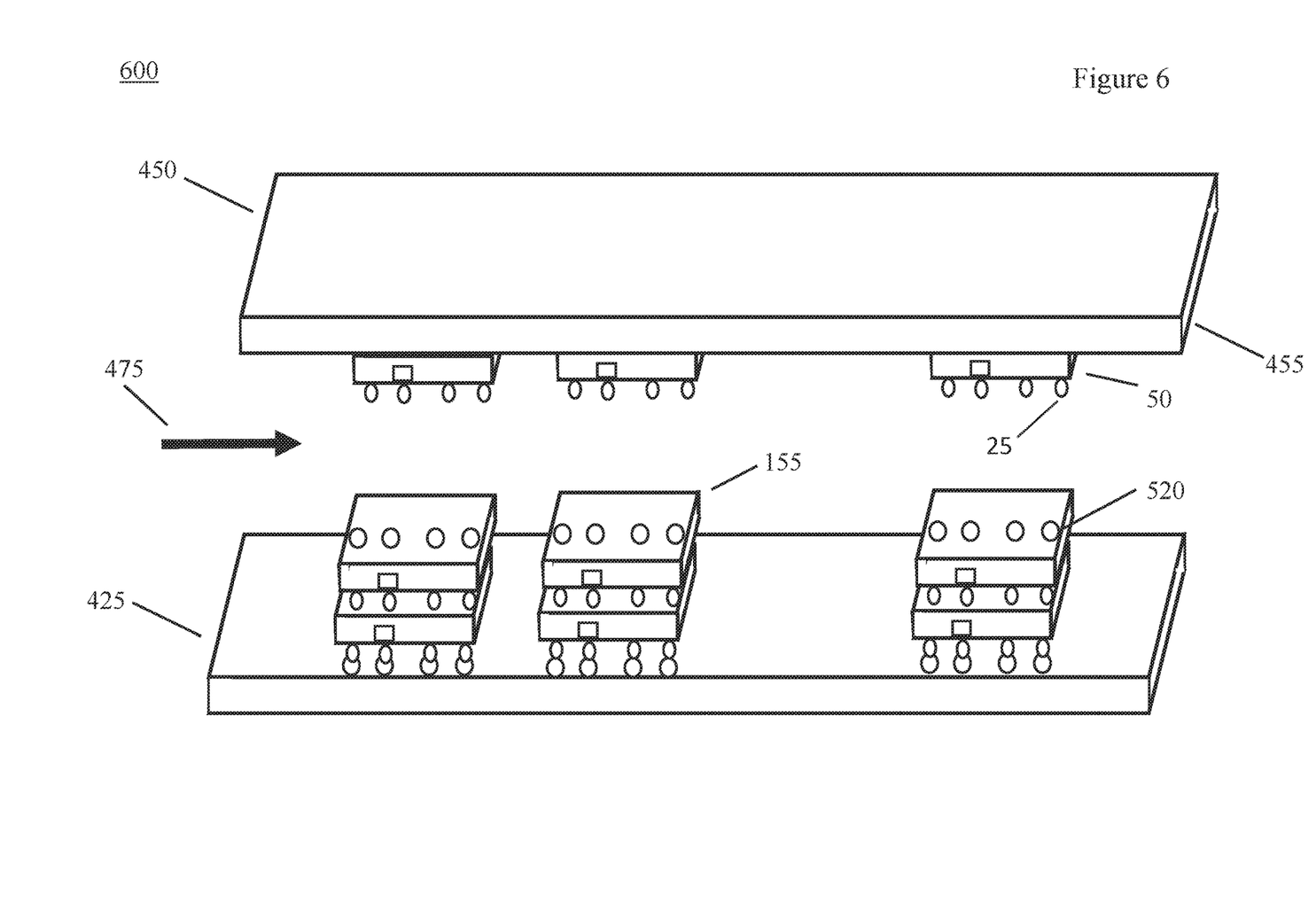
FIG. 6 is a diagram showing a process step of using a handler fixture apparatus positioning and holding a single or multiple dies while exposing the dies to a gaseous flux.

FIG. 6 is a diagram showing a holding/positioning and flux application process step 600 using a handler fixture apparatus 450, or handler 450, to position and securely hold single or multiple dies 50 while exposing the dies 50 to a gaseous flux 475 before bonding the electrical connections (25, 520 typically) together.

This process step 600 is similar to process step 400 except that the dies 50 held by the holder 450 are being exposed to the gaseous flux 475 before being bonded to contacts, typically 520, on dies 50 on die stacks 155 already bound to the substrate 425.

Note in the case of a reflow process, the handle fixture or vacuum fixture with die, die stacks, package or other components for assembly can be processed through the stationary or moving reflow furnace and handle removed after assembly bonding.

Figure 7:
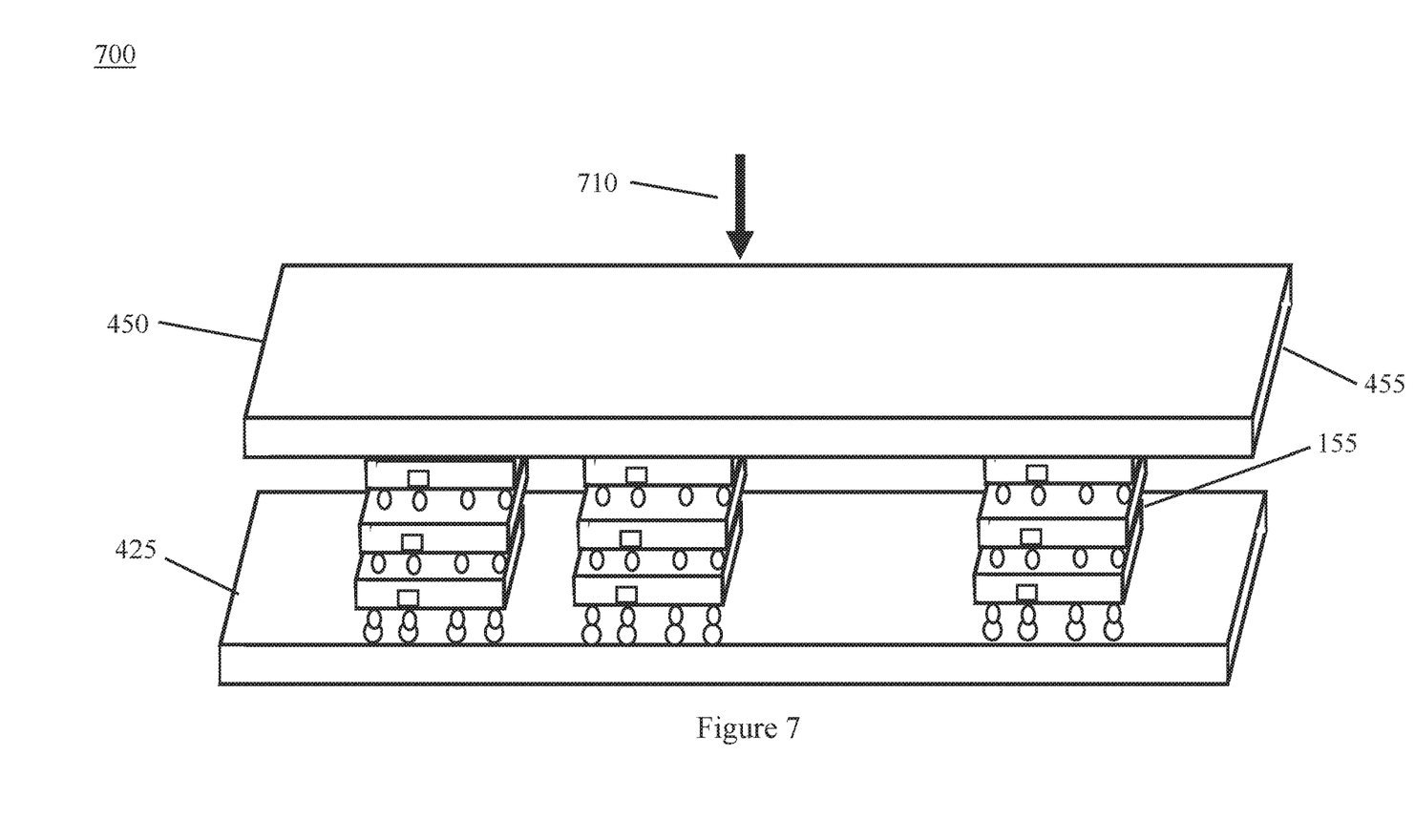
FIG. 7 is a diagram showing a bonding process step using a handler fixture apparatus to hold single or multiple thin dies securely while compressing electrical connections together and bonding.

FIG. 7 is a diagram showing a bonding process 700 using a handler fixture apparatus 450 to hold single or multiple thin dies 50 securely while compressing 710 electrical connections together 520 and bonding 700.

This process step 700 is similar to bonding process 500 except that the dies 50 held by the compressive force 710 on the holder 450 are being exposed to the gaseous flux 475 before being bonded to contacts, typically 520, on dies 50 on die stacks 155 already bound to the substrate 425.

In an alternative assembly process, rather than a sequential die assembly process using a handle or fixture for each die or parallel process of many dies being assembled sequentially, a reflow and thermal compressing bonding could be achieved for thinned die using the interconnection structure to provide a rigid stop for assembly for multi-high die stacks joining in one step. In this assembly method, a use of multiple rigid pillars or rigid ball in solder with controlled solder can provide a stop using for example thermal compression bonding following pick and place of one or more die into one or more die stacks simultaneously and then using force to cause all thinned die to be forced to flatness steps (i.e., copper pillars) during solder reflow. Once solder is again solidified after joining the entire stack can be held by the solidified solder and subsequently bonded using adhesives between layers as described above. Variations on this process flow can include use of pre-applied adhesive along with copper (Cu) pillar and solder and joining under vertical force to obtain multi-high thinned die assemblies in parallel.

Figure 8:
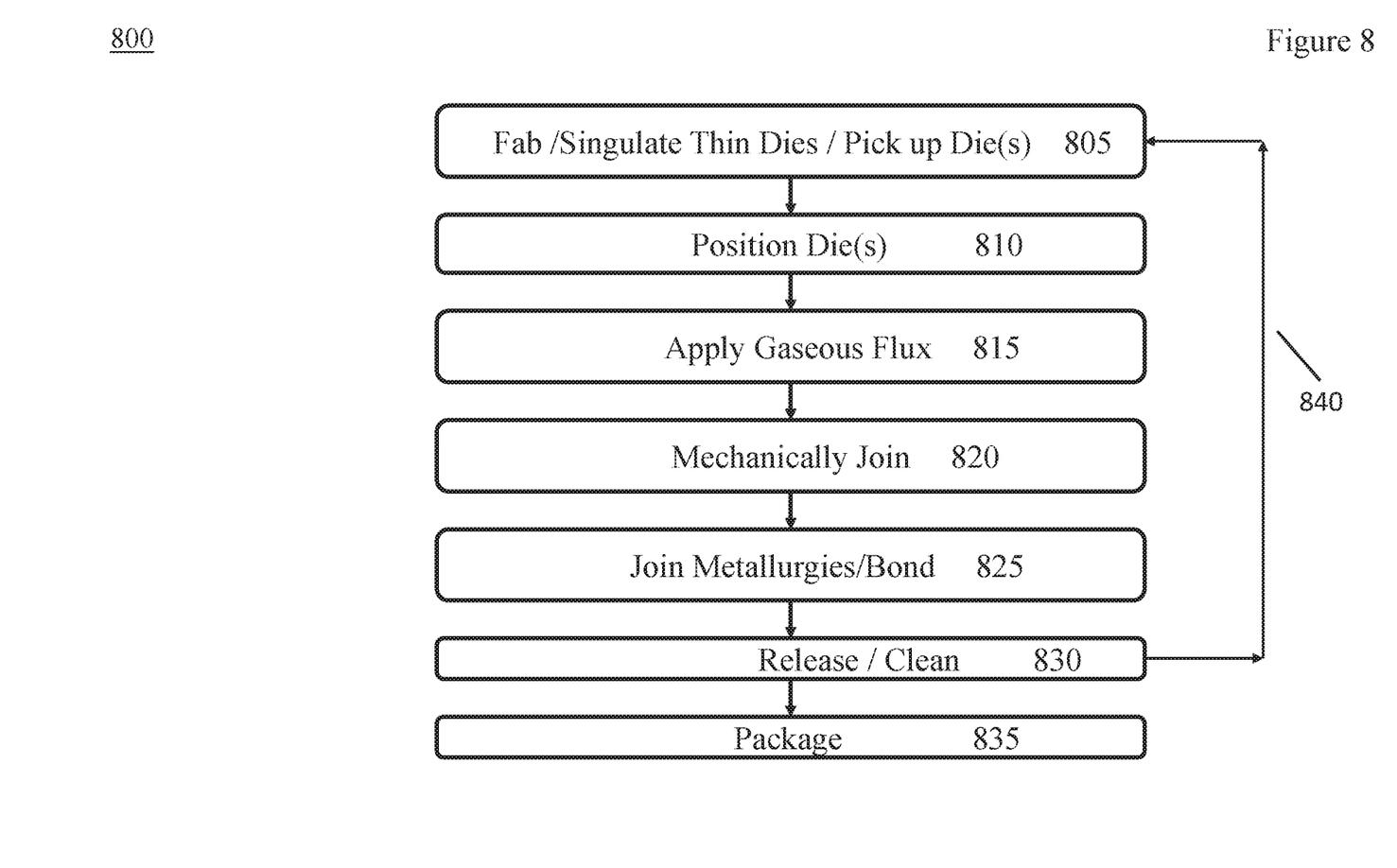
FIG. 8 is a flow chart showing the steps of making a single thinned die stack or an array of multiple thinned die stacks.

FIG. 8 is a flow chart showing the process 800 of making a single thinned die stack 155 or an array 150 of multiple thinned die stacks while maintaining the planarity of the die surface 55.

The process 800 begins with picking up or attaching 805 the thin dies 50 to the handle fixture, vacuum handle or holder 450. The holder can pick up one die 50 at a time or multiple dies 50 at a time. The positions of multiple dies 50 can be precision place or spaced 130 on the substrate (175, 425)—e.g. in an array, or the spacing can be customized to a particular substrate design and to precision alignment marks on the die, components, package and/or handle fixtures or holder such as by using precision optical cameras and precision X-Y movement tables. Die(s) 50 of different sizes and shapes can be accommodated at the same time.

The spacing can be designed in certain handlers 450. For instance, a vacuum chuck 200 can have channels 240 and porous regions in the vacuum chuck 200 layers that create a vacuum 245 only at specific locations on the bottom surface 255 of the vacuum chuck 200.

In other embodiments, the dies 50 can be created on the surface of a substrate, wafer, or dicing tape and attached to a handler 450 before the dies 50 are removed or singulated from the substrate. In this way there always is mechanical support for the thin die 50, either by the substrate and/or the handler 450, to prevent bending of the die 50.

In some embodiments, operations can be performed on the die(s) 50 before they are positioned 810. For example, die(s) 50 on the handler 450 can be further fabricated, thinned (e.g. using chemical mechanical polishing—CMP), and/or singulated such as on a wafer or dicing tape.

In step 810, the handler 450 holding the dies 50 moves and positions 810 the die 50 so that the electrical die contacts 25 are exposed to a gaseous flux 475. In alternative embodiments, the substrate connection 420 or device/die connections 520 are exposed 815 to the flux 475 as well.

In step 820, the handler 450 again positions the dies 50 so the die contacts 25 and opposite connections (420, 520) are compressively and mechanically forced/compressed 505 together. Because the surface 455 of the handler 450 is planar and the die surface(s) 55 bear on the handler surface 455, the die(s) 50 experience no bending during these processes and can be accurately held in place 820 until joined 825 in the next step. Etch stops may be used if needed to create precision X-Y and Z alignment for positioning 810 some applications.

In step 825, the die contacts 25 and the opposing contacts (420, 520) are electrically and mechanical joined/bonded 825 so that electrical connections are formed and mechanical rigidity is given to the die(s) 50. In many embodiments, the bonding 825 is done by metallurgically joining 825 the contacts (25, 420, 520), e.g. in a soldered connection. The bonding may be controlled by force per bump/multiple bumps or unit area or height management to create high yield assembly with precision alignment.

The die contacts 25 and opposing contacts (e.g. on a substrate 420, another die contact 520, and/or contacts on other devices, packages, or wafers) may be alternatively joined by means of placement with force (505, 710) followed by use of heating the joining members to a temperature that permit joining metallurgies to form a robust bond. Alternatively, surface tension may be used to align the die contacts 25 and opposing contact surfaces (e.g. 420, 520) for joining with precision At this point, the connections (25, 420, 520) are formed and the die(s) 50 have mechanical support to prevent bending so the handler 450 can be released/removed 830. Embodiments of the handler 450 removal 830 are disclosed in the description of FIGS. 2 and 3.

Once the handler 450 is released, the process steps 805 to 830 can be repeated 840 to add more die(s) 50 to the substrate 425 and/or to the top of die stacks 155 already on the substrate 425. The handler 450 may be re-used in these repeated steps. After each use, handler 450 is removed and may be cleaned before reuse. In this manor, die stacks 155 of multiple die(s) can be created.

The die stacks 155 created using this process have residual flux in the inter-die spacing 105, the substrate-die stack spacing 135, the inter-die stack spacing 130 that is less than 5% of the volume of any of these spaces. As an alternative, a height of residual flux (residual flux height 160) in these spaces (105, 135, and 130) is less than 50% of the respective spacing. In preferred embodiments, the residual flux height 165 is less than 20% of the spacing (105, 135, and 130 respectively) and can approach less than 5% of the spacing.

After repeating the steps 840 and completing creation of the die stacks 155 on the substrate 425, the die stacks 155 can be encased or packaged 835.

Note that following assembly, die stacks may benefit from underfill 190 adhesive application and cure 835, surface sealing 835 such as with dielectric coating and metal deposition such as with sputtering, PECVD, plating or alternates methods to improve reliability due to moisture barrier enhancement. These packaging treatments 835 can fill the voids between die connection spacing 30, inter-die spacing 105, substrate-die stack spacing, and inter die package spacing 130. The packaging can reduce damage from humidity. Heat transfer can be enhanced with number of electrical and thermally conductive interconnects and a choice of thermally enhanced underfill 190 materials such as with fillers having higher thermal conductivity like AlN, Al2O3, BeO, SiO2, etc.

Metallic packaging 825 can shield die(s) 50 and die stacks 155 from electromagnetic radiation, e.g. by creating a Faraday cage. Use of blanket deposited metal such as Al, Ni, W or alternate deposition to create encapsulation for robustness of interconnections, to avoid corrosion, moisture uptake issues, to aide in heat transfer and to shield the stack from electromagnetic interference.

Surface coating on the assembled stack 155 of Al, Ni, Cu/Ni, W, Ti/Cu/Ni or alternate coatings can provide a moisture barrier to improve stack assembly robustness and reliability in applications especially where fine pitch, higher current, higher humidity conditions maybe encountered to support high reliability.

Multiple alternates to process 800 are possible and are intend to within the scope of this invention.

Figure 9:
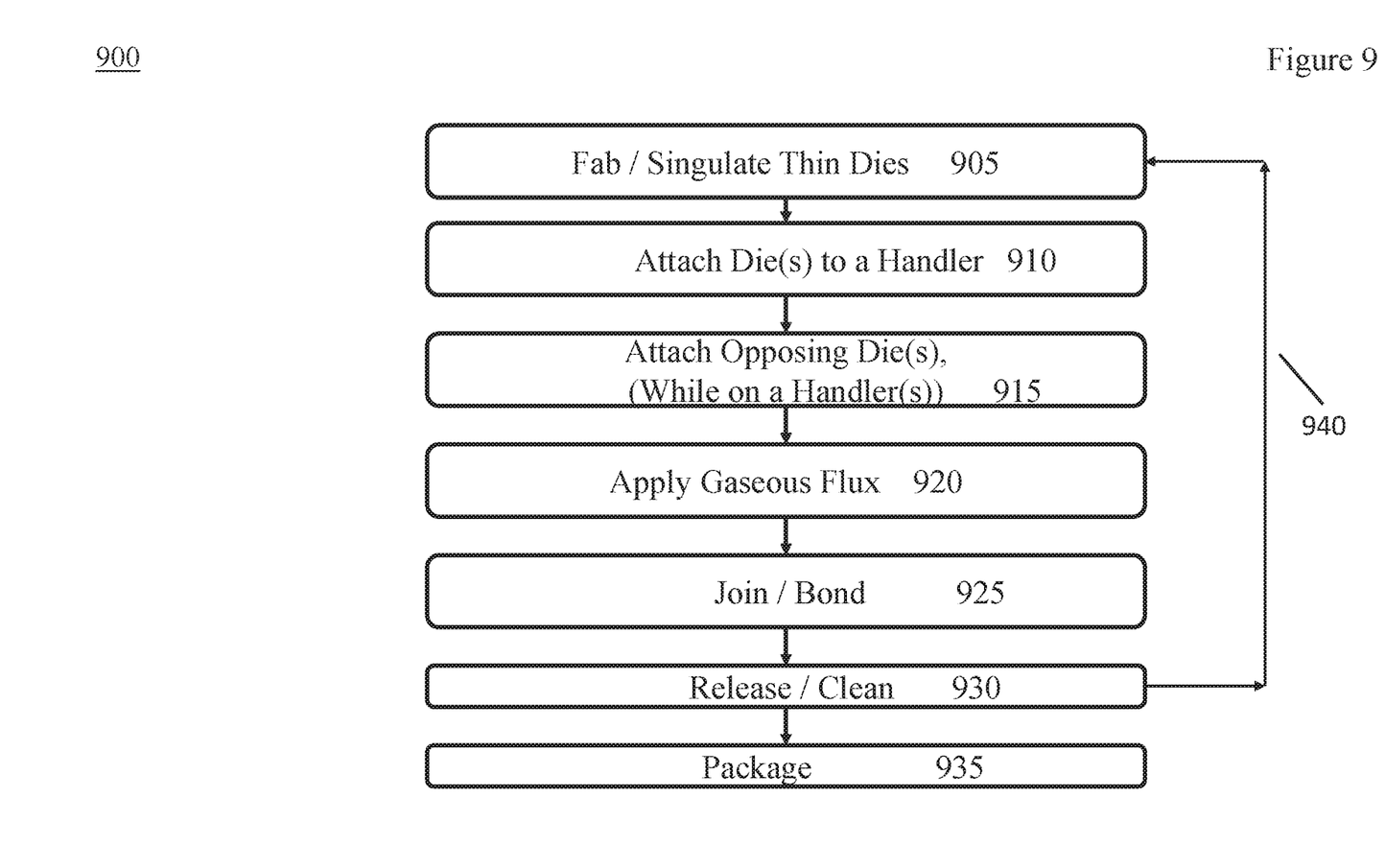
FIG. 9 is a flow chart showing an alternative assembly process using a handle fixture to perform small die to die stacking or die(s) to wafer stacking.

FIG. 9 is a flow chart showing an alternative assembly process 900 using a handle fixture to perform small die to die stacking or die(s) to wafer stacking.

In step 905, thin dies are fabricated, thinned and singulated such as on handle wafer or dicing tape.

In step 910, thin, singulated dies are attached to first handle fixture 450 with release layer and temporary adhesive transfer/release from handle wafer or dicing tape.

In step 915, thin dies, a package, or a wafer with opposing connections to be joined can also be thinned on a second handle fixture 450 or handle wafer.

In step 920, the dies and opposing die, package, or wafer are heated in gas flux such as formic acid in N2 or Forming Gas.

Step 925 is a joining/bonding sequence. There are 2 preferred embodiments of step 925.

One preferred embodiment of the joining/boding sequence 925 includes the die and opposing side die, package or wafers being joined using a thermal compression bonder to apply pressure to the joining members to a temperature that permits the joining metallurgies to form a robust bond. Bond may be controlled by force per bump or unit area or height management to create high yield assembly with precision alignment and planarity control using vacuum fixture.

After cooling the, handle fixture(s) 450 is(are) released 930 using laser debonding and oxygen-ash cleaning to permit reuse of fixture(s) 450. For assembling the dies into die stacks 155 and/or arrays 150, following an adhesive cleaning, additional joining can be achieved repeating process 940. Additional packaging steps 935 can also be performed as discussed above.

An alternative embodiment of the joining/bonding step 925 includes the die and opposing side die, package or wafers alternatively joined by means of placement with force followed by use of heating the joining members to a temperature that permit joining metallurgies to form a robust bond. Surface tension may be used to align the die and opposing surface for joining with precision, if needed use of precision etch stops maybe used if needed to create precision X-Y and Z alignment for some applications. After cool down the handle fixture 450 is removed/released 930 by laser and cleaning permits fixture reused and repeat 940 process permits additional die and/or component integration. Packaging steps 935 can be performed.

Figure 10:
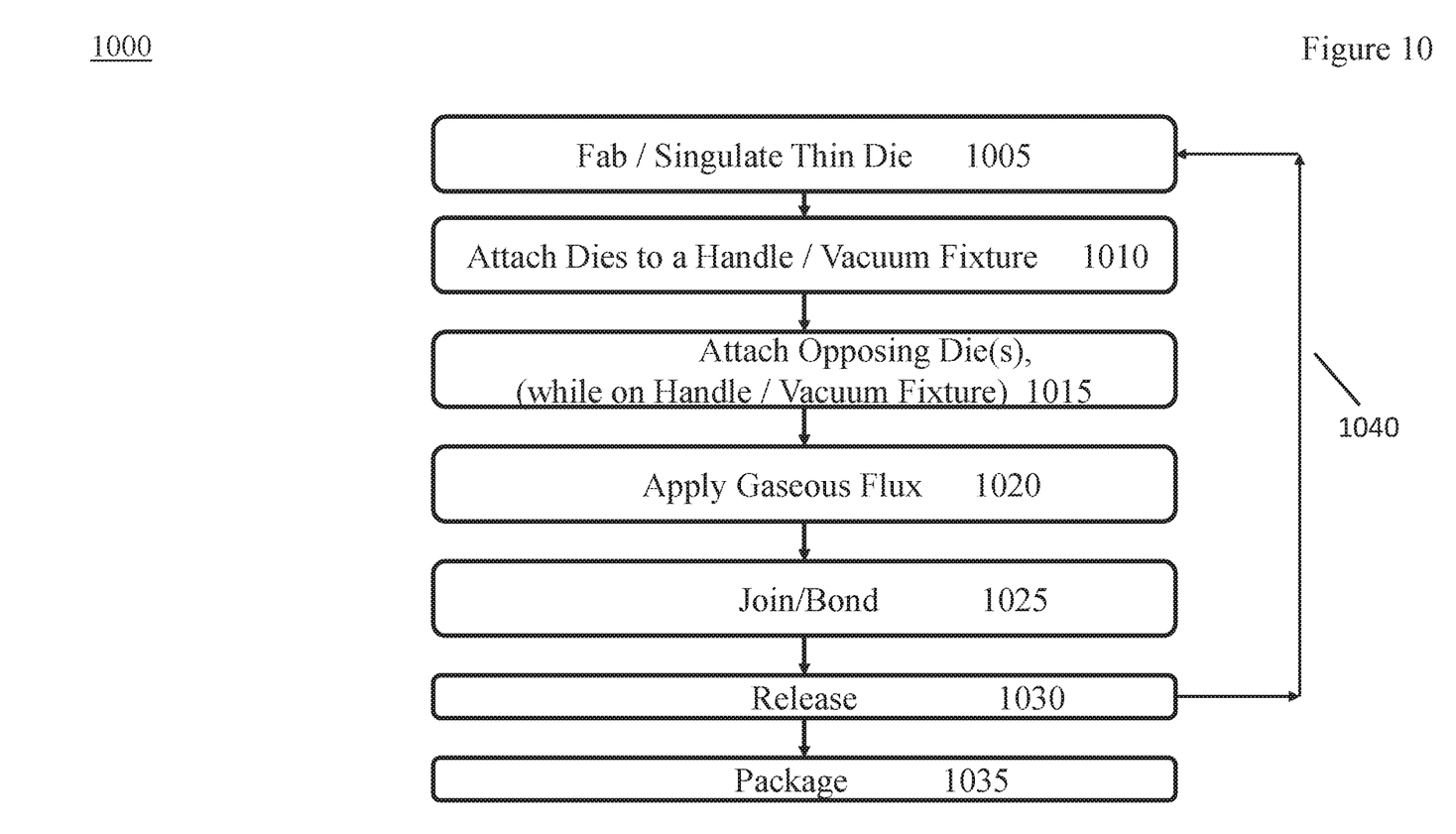
FIG. 10 Is a flow chart showing an alternative assembly process using vacuum fixture to perform small die to die stacking or die(s) to wafer stacking.

FIG. 10 Is a flow chart showing an assembly method 1000 using vacuum fixture to perform small die to die stacking or die(s) to wafer stacking.

In step 1005, thin dies are fabricated, thinned and singulated such as on handle wafer or dicing tape.

In step 1010 thin singulated dies are attached to vacuum fixture 200 with vacuum transfer/release from handle wafer or dicing tape.

In step 1015 dies, package, and/or wafer with opposing contacts to be joined can be thinned on second vacuum fixture 200 or handle wafer.

In step 1020, the dies and opposing dies, packages, and/or wafers are heated in gas flux such as formic acid in N2 or Forming Gas, as discussed above.

Step 1025 is a joining/bonding step with different preferred embodiments.

One preferred embodiment of step 1025 includes the die and opposing side die(s), package and/or wafers may be joined using a thermal compression bonder to apply pressure to the joining members to a temperature that permits the joining metallurgies to form a robust bond. Bond may be controlled by force per bump or unit area or height management to create high yield assembly with precision alignment and planarity control using vacuum fixture.

After cooling the vacuum fixture 200 is released 1030, as discussed above, to permit reuse of fixture and additional joining of next die or components for the application.

The steps 1005, 1010, 1015, 1020, 1025, and 1030 may be repeated 1040 to have additional die(s) and/or components added. Packaging 1035 is performed as discussed above.

An alternative preferred joining/bonding step 1025 includes the die and opposing side die(s), package and/or wafer alternatively being joined by means of placement with force followed by use of heating the joining members to a temperature that permit joining metallurgies to form a robust bond. Surface tension may be used to align the die and opposing surface for joining with precision, if needed use of precision etch stops may be used if needed to create precision X-Y and Z alignment for some applications.

After cooling down the vacuum fixture 200 is release/removed and can be reused post cleaning and assembly.

The steps 1005, 1010, 1015, 1020, 1025, and 1030 may be repeated 1040 to have additional die(s) and/or components added. Packaging 1035 is performed as discussed above.

Subsequent to build, electrical testing and or optical testing may be performed while the integrated components are held on the handle fixture or vacuum fixture if the component benefit from this method due to small size and precision test probes for testing and/or due to the mechanical integrity of the integrated assemblies to avoid yield loses. Testing examples such as using a built-in-self-test (BIST) or packaged system test or alternate testing can be employed. Non-limiting uses for the die stacks 155 and die stack arrays 150 include: integrated heterogeneous packages, 3 D die stacks, 2.5D assemblies, Artificial Intelligence (AI) packages, memory stacks, Internet of Things (IoT) packages, graphic or computation chips, high bandwidth memory, alternative memory, chip stacks, field-programmable gate arrays (FPGA's), and/or alternate system designed to meet specific functional requirements.

Note, functional die and/or other components or test circuitry may be incorporated in the test head to compliment built in self test (BIST) for full functional testing of partially assembled, fully assembled die or die stacks and heterogeneous packaged components.

Given this disclosure, other embodiments and uses of this invention would become apparent to one skilled in the art. These embodiments and uses are within the contemplation of this invention.

We claim:

1. A method of assembling a die stack comprising the steps of:
    holding one or more semiconductor dies on a handler, the semiconductor die having a die surface, a die thickness less than 50 microns, and one or more die connections;
    exposing the die connections to a gaseous flux to prepare the die connections for electrical and mechanical bonding to one or more opposing contacts, the opposing contacts also being exposed to the gaseous flux;
    compressing the die connections and the opposing contacts together while maintaining the die surface flat within 5 micron tolerance to a parallel flat plane;
    bonding the die connections and the opposing contacts; and
    releasing the handler from the semiconductor die.

2. The method, as in claim 1, where the opposing contacts are one or more of the following: contacts on the surface of a substrate, contacts on a second die, contacts on a second die in the die stack; and contacts on a device.

3. The method, as in claim 1, where the handler is a vacuum chuck that distributes a vacuum from a vacuum source connected to a first side of the vacuum chuck to a second side of the vacuum chuck, where the created vacuum on the second side is capable of holding one or more semiconductor dies against the second side, and the second side has a planarity within a 5 micron tolerance.

4. The method, as in claim 1, where the handler is a handle fixture, the handle fixture comprising a radiation transparent handle, a release layer, and an adhesive layer.

5. The method, as in claim 4, where the adhesive layer attaches to one or more of the semiconductor dies so the handle fixture can position the semiconductor dies against a bottom surface of the radiation transparent handle, and the semiconductor dies are released by ablating the release layer with radiation that can pass through the radiation transparent handle.

6. The method, as in claim 5, where the bottom surface of the radiation transparent handle is flat within a 5 micron tolerance.

7. The method, as in claim 1, where the gaseous flux is a composition of formic acid mixed with a nitrogen gas.

8. The method, as in claim 1, where the contacts are one or more of the following: solder to circuit pads, solder to solder, C4 connections, and copper to copper.

9. The method, as in claim 1, where the semiconductor dies are spaced evenly on the handler.

10. The method, as in claim 1, where the semiconductor dies are not spaced evenly on the handler.

11. The method, as in claim 1, further performing a testing step after bonding and before releasing, and while performing the testing step the handler is one of a handle fixture or a vacuum fixture and is used to hold any of one or more of the semiconductor dies while testing the die stack and while the die stack is being assembled.

12. The method, as in claim 3, where the second side of the vacuum chuck holds one or more of the semiconductor dies while performing one or more of the following steps: picking, placing, positioning, moving, machining, processing, and metallurgically bonding.

13. The method, as in claim 3, where the vacuum is distributed evenly over the second side.

14. The method, as in claim 3, where the vacuum is distributed to one or more points on the second side.

15. The method, as in claim 3, where the first side of the vacuum chuck is on a first layer and the second side of the vacuum chuck is on a second layer.

16. The method, as in claim 15, where one or more of the first side and second side are sealed.

17. The method, as in claim 15, where the second layer is smooth and rigid with a deviation in flatness less than 5 microns.

18. The method, as in claim 15, where the second layer of the vacuum chuck is made of one or more of the following compositions: a ceramic, SiC, Si3N4, Al2O3, Si, and Si with etched channels.

19. The method, as in claim 15, where the second layer is porous.

20. The method, as in claim 15, where the first layer of the vacuum chuck has vacuum channels through the first layer and is made of one or more of the following compositions: a rigid material, silicon (Si), glass, metal, ceramic, and a polymer.

* * * * *